United States Patent
Potera et al.

(10) Patent No.: US 11,410,990 B1
(45) Date of Patent: Aug. 9, 2022

(54) SILICON CARBIDE MOSFET WITH OPTIONAL ASYMMETRIC GATE CLAMP

(71) Applicant: SemiQ Incorporated, Lake Forest, CA (US)

(72) Inventors: Rahul R. Potera, Irvine, CA (US); Carl A. Witt, Lake Forest, CA (US)

(73) Assignee: SEMIQ INCORPORATED, Lake Forest, CA (US)

( * ) Notice: Subject to any disclaimer, the term of this patent is extended or adjusted under 35 U.S.C. 154(b) by 149 days.

(21) Appl. No.: 17/071,695

(22) Filed: Oct. 15, 2020

Related U.S. Application Data

(60) Provisional application No. 63/070,121, filed on Aug. 25, 2020.

(51) Int. Cl.

| | |
|---|---|
| H01L 27/02 | (2006.01) |
| H01L 29/16 | (2006.01) |
| H01L 29/06 | (2006.01) |
| H01L 29/66 | (2006.01) |
| H01L 29/78 | (2006.01) |
| H01L 29/10 | (2006.01) |
| H01L 21/78 | (2006.01) |
| H01L 21/66 | (2006.01) |

(52) U.S. Cl.
CPC .......... *H01L 27/0274* (2013.01); *H01L 21/78* (2013.01); *H01L 22/12* (2013.01); *H01L 27/0255* (2013.01); *H01L 29/0692* (2013.01); *H01L 29/0696* (2013.01); *H01L 29/1095* (2013.01); *H01L 29/1608* (2013.01); *H01L 29/66068* (2013.01); *H01L 29/7815* (2013.01)

(58) Field of Classification Search
CPC .......... H01L 29/0696; H01L 29/7815; H01L 29/1095; H01L 29/0692; H01L 27/0274; H01L 27/0255
See application file for complete search history.

(56) References Cited

U.S. PATENT DOCUMENTS

| | | | | |
|---|---|---|---|---|
| 10,818,789 B2 * | 10/2020 | Kumada | ............ | H01L 29/0619 |
| 11,121,248 B2 * | 9/2021 | Suzuki | ............... | H01L 29/1608 |
| 11,309,415 B2 * | 4/2022 | Nakamura | .......... | H01L 29/7819 |

(Continued)

FOREIGN PATENT DOCUMENTS

EP 3979330 A1 * 4/2022 ......... H01L 29/0626

*Primary Examiner* — Bilkis Jahan
*Assistant Examiner* — Victor V Barzykin
(74) *Attorney, Agent, or Firm* — The Law Offices of Bradley J. Bereznak

(57) ABSTRACT

A silicon carbide MOSFET device includes a gate pad area, a main MOSFET area and a secondary MOSFET area. A main source contact is electrically coupled to the source region of each of the main MOSFETs, and a separate secondary source contact is electrically coupled to the source region of each of the secondary MOSFETs. A gate contact electrically connects to each of the insulated gate members of the main and secondary MOSFETs. An asymmetric gate clamping circuit is coupled between the secondary source contact and the gate contact. In a first mode of operation of the MOSFET device the main source contact is electrically coupled with the secondary source contact to activate the gate clamping circuit. When activated, the circuit clamping a gate-to-source voltage to a first clamp voltage in an on-state of the MOSFET device, and to a second clamp voltage in an off-state of the MOSFET device.

16 Claims, 4 Drawing Sheets

(56) References Cited

U.S. PATENT DOCUMENTS

| | | | |
|---|---|---|---|
| 2010/0200920 A1* | 8/2010 | Su ...................... | H01L 29/7803 |
| | | | 257/E21.411 |
| 2011/0227155 A1* | 9/2011 | Su ...................... | H01L 29/0653 |
| | | | 257/E21.409 |
| 2016/0027771 A1* | 1/2016 | Su ...................... | H01L 27/0629 |
| | | | 257/355 |
| 2018/0047722 A1* | 2/2018 | Nishimura .......... | H01L 29/7803 |
| 2019/0341483 A1* | 11/2019 | Harada ................. | G01R 19/10 |
| 2020/0020800 A1* | 1/2020 | Kumada ................ | H01L 24/09 |
| 2020/0335622 A1* | 10/2020 | Hiyoshi .............. | H01L 29/7803 |
| 2021/0091220 A1* | 3/2021 | Sugawara ........... | H01L 29/7813 |
| 2021/0202470 A1* | 7/2021 | Hsieh .................... | H01L 29/866 |
| 2021/0280712 A1* | 9/2021 | Hoshi ................. | H01L 29/0623 |
| 2022/0102487 A1* | 3/2022 | Siemieniec .......... | H01L 29/0626 |
| 2022/0102549 A1* | 3/2022 | Weyers .............. | H01L 29/7808 |

* cited by examiner

SILICON CARBIDE MOSFET WITH OPTIONAL ASYMMETRIC GATE CLAMP

TECHNICAL FIELD

The present disclosure relates to silicon carbide power semiconductor devices. More specifically, the present invention relates to silicon carbide (SiC) metal-oxide semiconductor field-effect transistor (MOSFET) device structures and layouts that provide an asymmetric bidirectional voltage clamp between the gate and source to protect the gate oxide of SiC MOSFET from overvoltage stress.

BACKGROUND

High-voltage, field-effect transistors, also known as power transistors or power semiconductor devices, are well known in the semiconductor arts. Most often, a high-voltage power transistor comprises a planar or vertical transistor device structure that includes an extended drain or drift region that supports the applied high-voltage when the device is in the "off" state. These power transistor devices can be switched at high voltages and achieve a high blocking voltage in the "off" state while minimizing the resistance to current flow between the drain and source, often referred to as the specific on-resistance ($R_{on}$), in the "on" state.

Power MOSFETs are commonly based on silicon and other wide bandgap semiconductor materials, such as silicon carbide. SiC MOSFETs are advantageously utilized in certain electronic devices due to their superior physical properties over silicon-based devices of the same device area. For example, SiC MOSFETs are known to exhibit higher blocking voltage, lower $R_{on}$, and higher thermal conductivity as compared to silicon MOSFETs. A double-implanted metal-oxide semiconductor field-effect transistor (DMOSFET) may be formed in a SiC substrate.

In contrast to Si MOSFETS, SiC MOSFETS require significant overdrive of the gate voltage to increase channel conductance and achieve a low on-resistance. For example, a SiC planar DMOSFET may be driven to an electric field of ~ 4 MV/cm in the on-state. At such a high electric field the gate oxide is less reliable. For this reason, clamping of the gate-to-source voltage ($V_{GS}$) in both the on-state and off-state directions is necessary to avoid voltage overshoot and insure the long-term reliability of the gate oxide. By way of example, in a SiC DMOSFET having $V_{GSMAX}$=25 V and $V_{GSMIN}$=−10 V, it may be desirable to clamp $V_{GS}$ to 30 V in the on-state and to −12 V in the off-state.

One of the problems that arise is that the SiC MOSFET gate oxide needs to be tested during burn-in at voltages which are greater than the clamping voltage, and also at high temperatures, to screen devices that might be vulnerable to fail during their normal operating life. Prior gate clamping approaches have been unable to adequately accommodate high-voltage, high temperature burn-in testing.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

Figure 1A:
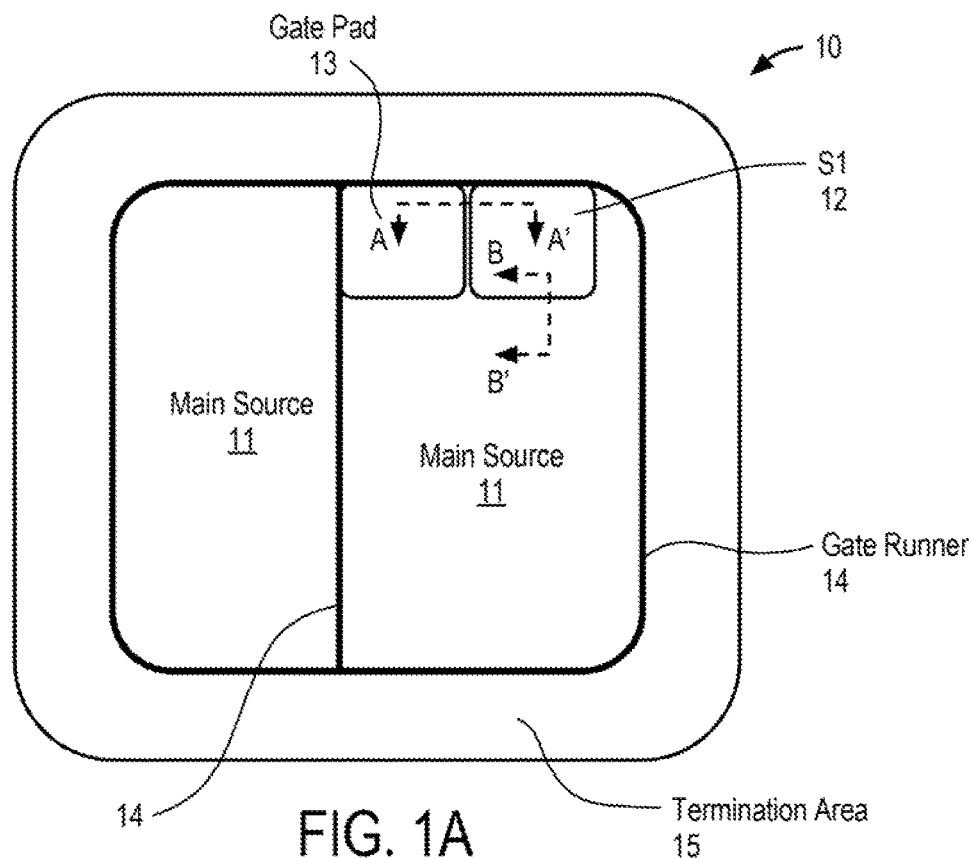
FIG. 1A is a top view of an example SiC MOSFET device layout suitable for wafer level stress testing.

Corresponding reference characters indicate corresponding components throughout the several views of the drawings. Skilled artisans will appreciate that elements in the figures are illustrated for simplicity and clarity and have not necessarily been drawn to scale. Also, common but well-understood elements that are useful or necessary in a commercially feasible embodiment may not be depicted in order to facilitate a less obstructed view of these various embodiments of the present disclosure.

DETAILED DESCRIPTION

In the following description numerous specific details are set forth in order to provide a thorough understanding of the present invention. It will be apparent, however, to one having ordinary skill in the art that the specific details need not be employed to practice the present invention. In other instances, well-known systems, devices, or methods have not been described in detail in order to avoid obscuring the present invention.

Reference throughout this specification to "one embodiment", "an embodiment", "one example" or "an example" means that a particular feature, structure or characteristic described in connection with the embodiment or example is included in at least one embodiment of the present invention. Thus, appearances of the phrases "in one embodiment", "in an embodiment", "one example" or "an example" in various places throughout this specification are not necessarily all referring to the same embodiment or example. Furthermore, the particular features, structures or characteristics may be combined in any suitable combinations and/or sub-combinations in one or more embodiments or examples. Particular features, structures or characteristics may be included in an integrated circuit, an electronic circuit, a combinational logic circuit, or other suitable components that provide the described functionality. In addition, it is appreciated that the figures provided herewith are for explanatory purposes to persons ordinarily skilled in the art and that the drawings are not necessarily drawn to scale.

For purposes of this disclosure, "ground" or "ground potential" refers to a reference voltage or potential against which all other voltages or potentials of a circuit or integrated circuit (IC) are defined or measured.

As used herein, a "wafer" is a thin slice of crystalline material, such as silicon carbide, used in the fabrication of semiconductor devices and integrated circuits. The term "substrate" refers to the semiconductor supporting material upon which or within which the elements of a semiconductor device are fabricated, which substantially comprises the thickness of a wafer. Upon completion of the fabrication process the wafer is typically scribed and broken into individual semiconductor die, each of which consists of one or more semiconductor devices.

In the context of the present application, when a transistor is in an "off state" or "off" the transistor does not substantially conduct current. Conversely, when a transistor is in an "on state" or "on" the transistor is able to substantially conduct current. By way of example, a power transistor may comprise an N-channel MOSFET with a SiC substrate and SiC epitaxial layer which, in the off-state, supports a high blocking voltage between the first terminal, a drain, and the second terminal, a source. The power MOSFET may comprise a power switch that is driven by an integrated controller circuit to regulate energy provided to a load.

A SiC MOSFET device structure having a design and layout that provides for an optional gate clamp is described. In one implementation, the gate clamp is not activated during high voltage screening or burn-in testing, thus allowing voltages greater than a clamp voltage to be applied to the gate. After screening, the gate-to-source clamp is activated during packaging by wire bonding multiple source areas to a common source pad or terminal.

FIG. 1A is a top view of an example SiC MOSFET device 10 with a specific layout arranged on a portion of a semiconductor wafer. As shown, the MOSFET cell includes main source areas 11, a gate pad 13, and a smaller, secondary (S1) source area 12. Main source areas 11 and S1 source area 12 include SiC transistor device structures which are typically replicated many times.

Main source areas 11 have source regions that are metalized separately from the source regions of the S1 source area 12. In other words, the source regions of the MOSFET devices in S1 source area 12 are electrically isolated from the source regions of the MOSFET devices in main source areas 11. The MOSFET devices in main source areas 11 and also in S1 source area 12 share a common drain region in the SiC epitaxy and substrate. In addition, the gate members (e.g., polysilicon) of the MOSFETS in main source areas 11 and S1 source area 12 are commonly coupled to gate pad 13.

As described below in conjunction with the cross-sectional views of FIGS. 2 & 3, in one embodiment, the S1 source contact in area 12 is physically separated and electrically isolated from the source contacts in main source areas 11 by multiple (e.g., 2 to 5) floating P+ implant regions, each of which is laterally separated from one another by a predetermined distance x (e.g., ~0.8 µm to 1.0 µm). Similarly, a floating P-well region (PW1) is disposed between S1 source area 12 and gate pad 13. The P-well region PW1 is separated from gate pad 13 and S1 area 12 by multiple (e.g., 2 to 5) floating P+ implant regions, each of which is laterally separated from a neighboring P+ region by a predetermined distance y (e.g., ~0.8 µm to 1.0 µm).

Gate pad 13 is electrically coupled to each of the polysilicon gate members of all of the MOSFET devices via a metalized gate runner 14. A termination area 15 isolates the MOSFET device from neighboring devices (die) on the wafer.

Practitioners in the art will appreciate that FIG. 1A shows the MOSFET device before wire bonding, such that gate-to-source clamping is not activated. This allows wafer-level reliability/stress testing of the MOSFET device at higher $V_{GS}$ voltages, beyond what the device experiences during normal operation.

Figure 1B:
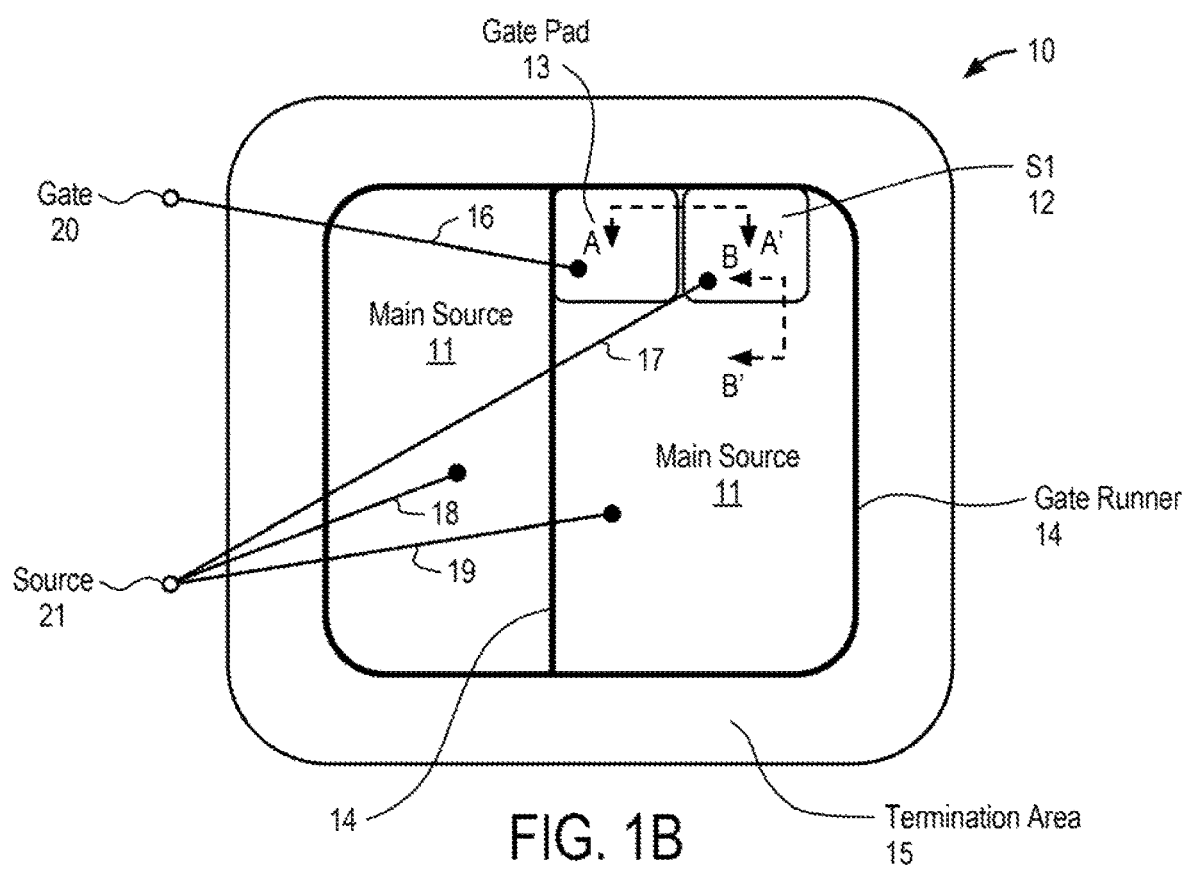
FIG. 1B is a top view of the example SiC MOSFET device layout shown in FIG. 1A after gate clamping has been activated at the package level.

FIG. 1B is a top view of the example SiC MOSFET device 10 shown in FIG. 1A after gate clamping has been activated at the package level. This is achieved by wire bonding the main source areas 11 and S1 source area 12 to a common source terminal 21 of the package. As shown, wire 17 electrically couple the source metal contact in S1 area 12 to source terminal 21, whereas wires 18 & 19 electrically couple the source metal contact in main areas 11 to source terminal 21. Wire 16 couples gate pad 13 to a gate terminal 20 of the package. Thus, wire bonding electrically couples the S1 source area 12 to main source area 11, which activates the asymmetric gate clamp circuitry coupled between gate and source terminals.

In another embodiment, a small sense resistor is connected in series with wire 17 between the S1 source area contact and source terminal 21. During normal operation a small amount of current, relative to the total source current, flows through the sense resistor and S1 source area contact. Since the ratio of current flowing through the main source area MOSFET versus the S1 area MOSFET is known, the voltage drop across the sense resistor may be monitored and utilized for protection to turn off the main transistor to prevent overcurrent damage.

Figure 2:
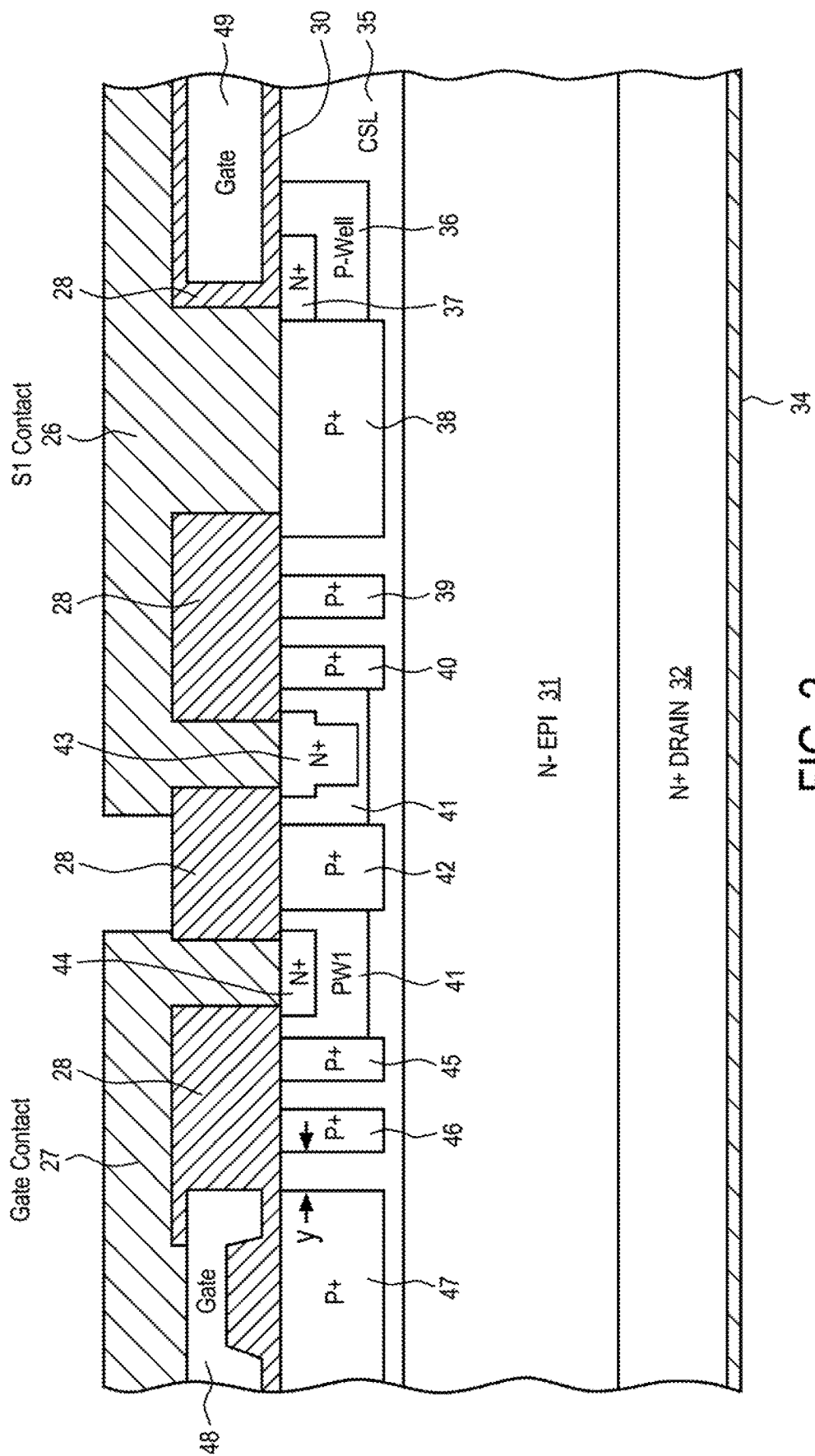
FIG. 2 is an example cross-sectional side view of the SiC MOSFET device layout shown in FIGS. 1A & 1B, as taken along cut lines A-A'.

FIG. 2 is an example cross-sectional side view of the planar SiC MOSFET device layout shown in FIGS. 1A & 1B, taken along cut lines A-A'. This cross-section shows various regions in the SiC substrate that comprise an asymmetric gate clamp circuit. On the left-hand side of the figure a gate metal contact 27 is shown electrically connected to a polysilicon gate member 48 and also to an N+ region 44. Gate contact 27 comprises gate pad 13 shown in FIGS. 1A & 1B. The right-hand side of the figure shows S1 metal contact 26 electrically connected to P+ region 38 as well as to N+ region 43.

In addition, FIG. 2 shows a P+ region 47 disposed beneath gate member 48, and a P+ region 42 disposed beneath an interlayer dielectric layer (IDL) 28 in a PW1 (well) region 41 that extends across a boundary area separating gate pad 13 and S1 source area 12. On the left-hand side, a narrow floating P+ region 46 is shown disposed in CSL 35 laterally separated from adjacent P+ regions 47 and 45. Similarly, on the right-hand side a narrow floating P+ region 39 is shown disposed in CSL 35 laterally separated from adjacent P+ regions 38 and 40. As shown, adjacent P+ regions 46 and 47 are laterally separated by the distance y, which in one embodiment is ~0.8 µm to 1.0 µm wide. In one embodiment, adjacent P+ regions 38 and 39 are also separated by the distance y.

It is appreciated that in various embodiments there may be more than one P+ region 46 disposed between P+ regions 47 & 45. In other words, there may be multiple spaced-apart P+ regions 46 (e.g., 2-3) disposed in CSL 35 between P+ regions 47 & 45. The same is true for P+ region 39; namely, that there may be multiple spaced-apart P+ regions 39 (e.g., 2-3) disposed between P+ regions 40 & 38.

A SiC MOSFET is located in the S1 area on the right-hand side of FIG. 2. The SiC MOSFET includes a gate polysilicon member 49 disposed in ILD 28. Gate member is insulated from the planar top surface 30 by a thin gate oxide which extends over an N+ source region 37 and a P-Well region 36, both of which are disposed in a highly-doped N+ current spreading layer (CSL) 35. In the on-state, a conductive channel region is formed in the area of P-Well 36 just below top planar surface 30.

CSL 35 extends vertically down to a lightly-doped N-epitaxy layer 31. A portion of CSL 35 extends upward to planar top surface 30. N-epitaxial layer 31 is disposed above a highly-doped N+ drain 32 and a bottom SiC substrate (not shown). Drain region 32 is disposed on a planar surface of the bottom substrate. A bottom metal layer 34 forms a drain terminal that provides electrical (ohmic) contact with N+ drain region 32. Epitaxial layer 31 forms an extended drain or drift region of the SiC MOSFET. Epitaxial layer 31 may be formed by a Chemical Vapor Deposition (CVD) process.

Practitioners in the semiconductor arts will appreciate that an asymmetric gate clamp structure is formed by the floating PW1 region 41, P+ regions 45, 42, 40, deep N+ region 43 electrically connected to S1 contact 26, and shallow N+ region 44 electrically connected to gate contact 27. In one embodiment, PW1 region 41 has a retrograde doping profile wherein the doping concentration increases farther down from substrate surface 30. That is, the highest doping concentration is near the bottom of PW1 region 41.

Because N+ region 43 connected to the source contact extends deeply into PW1 region 41, and PW1 region 41 has a retrograde doping profile, the breakdown voltage of the p-n junction formed at the bottom of N+ region 43 (S1 contact 26 to PW1 region 41) is lower as compared with the breakdown voltage of the p-n junction formed at the bottom of shallow N+ region 44 connected to the gate (gate contact 27 to PW1 region 41), thus achieving breakdown voltage asymmetry. The gate-to-source clamp voltage is the series sum of the breakdown voltage of the junction between N+ region 43 and PW1 region 41, and the forward biased junction between PW1 region 41 and N+ region 44. Conversely, the source-to-gate clamp voltage is the series sum of the breakdown voltage of the junction between N+ region 44 and PW1 region 41, and the forward biased junction between PW1 region 41 and N+ region 43.

In one example, the shallow N+ region 44 to PW1 region 41 blocks gate-to-source clamp voltage ($V_{GSClamp}$) to approximately 27 V to 30 V. That is, when $V_{GS} > V_{GSClamp}$ is attempted, $V_{GS}$ will be clamped to $V_{GSClamp}$ and not allowed to rise above it. Positive values of $V_{GS}$, wherein $V_{GS} < V_{GSClamp}$, are allowed. In the opposite direction, the deep N+ region 43 to PW1 region 41 blocks source-to-gate clamp voltage ($V_{GSClamp}$) to approximately −12 V to −15 V in one embodiment. This means that values of $V_{GS}$ that are more negative than $V_{GSClamp}$ are clamped to $V_{GSClamp}$. On the other hand, if $V_{GS}$ is negative, but not more negative than $V_{GSClamp}$, then those values of $V_{GS}$ are allowed.

As discussed earlier, the asymmetric gate clamp is not activated or invoked until S1 contact 26 is wire bonded to a source terminal which is also wire bonded to the main source area of the MOSFET. Note that S1 contact 26 electrically contacts P+ contact region 38 and N+ source region 37. As shown, N+ source region 37 adjoins P+ contact region 38 and P-Well region 36.

The P-Well regions in the MOSFET (such as P-Well region 36) as well as the floating PW1 region 41 between S1 contact 26 and gate contact 27, are retrograde doped such that the lowest doping concentration is near top surface 30, increasing to the highest doping concentration near the bottom of the well. By way of example, in one embodiment the surface doping concentration is in a range of approximately $1E17/cm^3$ to $2E17/cm^3$, with peak doping near the bottom of the well in a range of approximately $2E18/cm^3$ to $5E18/cm^3$. In one embodiment, the depth of the P-Well and PW1 regions is the same, e.g., approximately 1.0 µm to 1.5 µm.

Note that in one embodiment N+ implant region 44 (connected to gate contact 27) in PW1 region 41 is the same implant as the N+ source implant in the MOSFET cells (e.g., N+ region 37). In the example of FIG. 2 this implant is 0.2 µm to 0.5 µm deep and doped to a concentration greater than $1E19/cm^3$ up to a maximum of approximately $1E20/cm^3$. N+ region 43 (connected to S1 contact 26) in PW1 region 41 is implanted to a depth of approximately 0.6 µm to 0.8 µm deep with a doping concentration greater than $1E19/cm^3$ up to a maximum of approximately $1E20/cm^3$. The depth of PW1 region 41 is deeper than the deep N+ implant such that beneath the N+ implant there is a sufficient dose of PW1 to block drain-source voltage without punchthrough.

Figure 3:
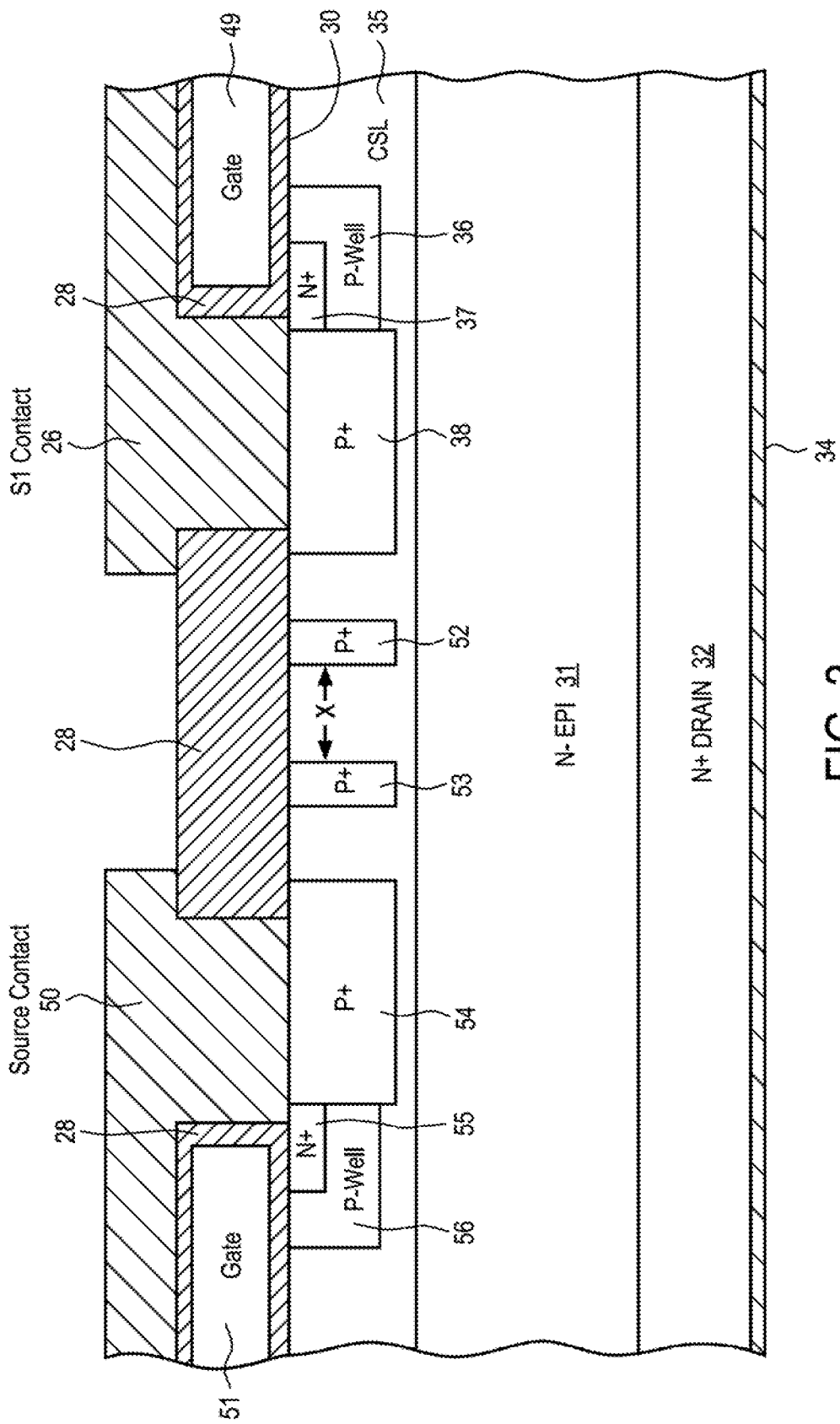
FIG. 3 is an example cross-sectional side view of the SiC MOSFET device layout shown in FIGS. 1A & 1B, as taken along cut lines B-B'.

FIG. 3 is an example cross-sectional side view of the planar SiC MOSFET device layout shown in FIGS. 1A & 1B, taken along cut lines B-B'. On the left-hand side of the figure a MOSFET cell is shown disposed under a main source contact 50, which cell included a polysilicon gate member 51 disposed in ILD layer 28. Gate member 51 is insulated from substrate surface 30 by a thin gate oxide. Gate member 51 extends laterally over a portion of N+ source region 55 and a portion of P-Well region 56 that extends vertically to surface 30. Source contact 50 electrically contacts P+ contact region 54 and N+ source region 55, both of which also adjoin P-Well region 56.

During on-state operation, current flows laterally from N+ source region 55, across an n-channel conduction region formed in P-Well region 56 just beneath top planar surface 30, then down through CSL 35, N-epi layer 31 to N+ drain region 32.

On the right-hand side of the figure a MOSFET cell is shown disposed under S1 source contact 26, which cell includes a polysilicon gate member 49 disposed in ILD layer 28. Gate member 49 is insulated from substrate surface 30 by a thin gate oxide. Gate member 49 extends laterally over a portion of N+ source region 37 and a portion of P-Well region 36 that extends vertically to surface 30. S1 contact 26 electrically contacts P+ contact region 38 and N+ source region 37, both of which adjoin P-Well region 36. All of the N+, P+ and P-Well regions are disposed in N-Type CSL 35.

Note that two floating P+ regions 52 & 53 are disposed in CSL 35 spaced-apart by a lateral distance x between P+ regions 38 & 54. A portion of ILD 28 that is disposed above floating P+ regions 52 & 53 separates source contact 50 from S1 contact 26. Persons of ordinary skill in the semiconductor arts will understand that floating P+ regions 52 & 53 effectively electrically isolate source contact 50 from S1 contact 26, thereby allowing wafer level stress testing at high voltages without gate clamping and high drain voltage during one mode of device operation.

In one embodiment, the lateral distance x between P+ regions 38 & 54 is in a range of approximately 0.8 µm to 1.0 µm wide. The same or a different distance may separate P+ region 52 from P+ region 38, as well as P+ region 53 from P+ region 54.

It is appreciated that although two floating P+ regions are shown in FIG. 3, other embodiments may have more floating P+ regions (e.g., 3-5).

Figure 4:
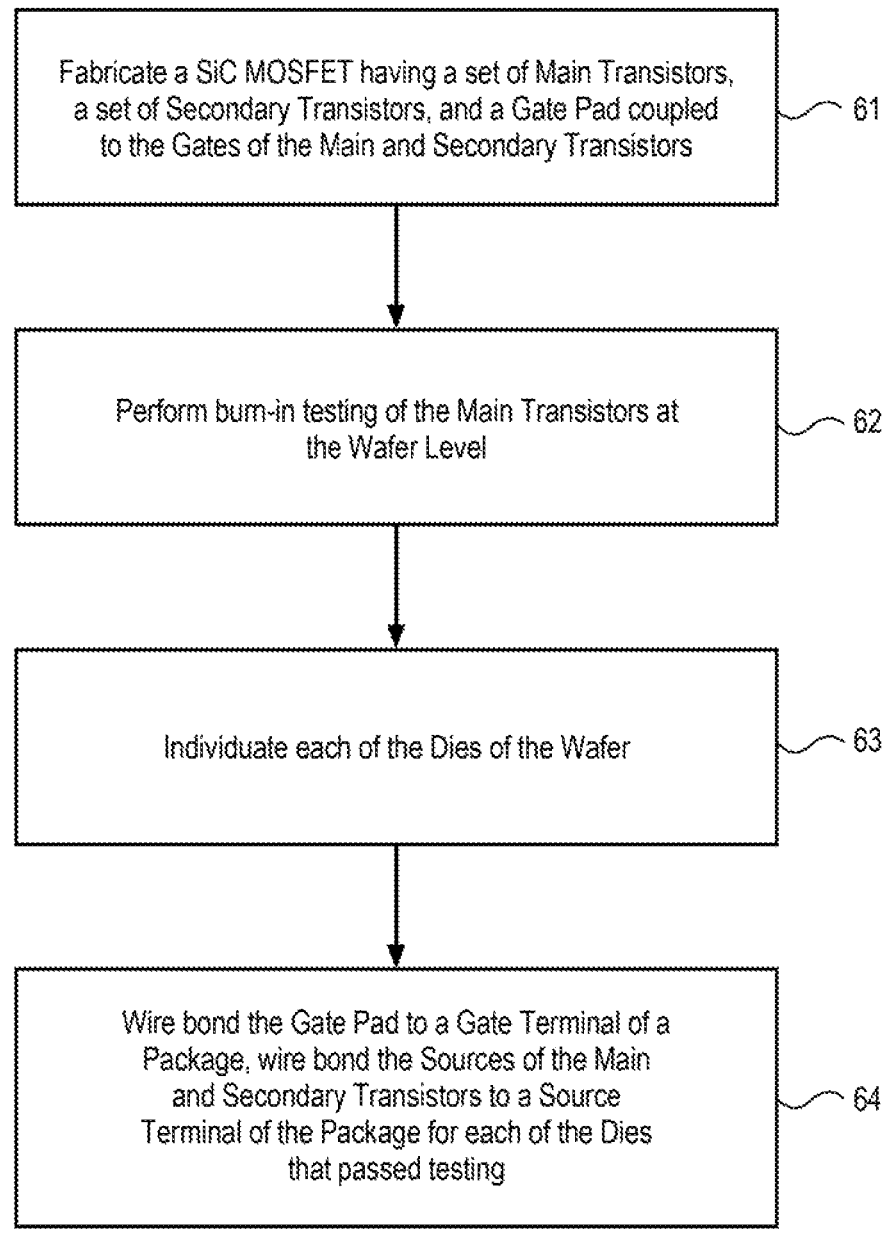
FIG. 4 is an example flowchart diagram for a method of manufacturing SiC MOSFET devices with optional asymmetric gate clamping.

FIG. 4 is an example flowchart diagram for a method of manufacturing SiC MOSFET devices with optional asymmetric gate clamping. The process begins in block 61 with the fabrication of a set of main MOSFET cells and a smaller set of one or more secondary S1 MOSFET cells, as shown in the example layouts of FIGS. 1A & 1B. Main MOSFET cells as well as secondary S1 MOSFET cells share the same drain contact and extended drain in the epitaxial region. The fabrication step includes forming a gate pad that is coupled to the individual polysilicon gates of all the MOSFETs. Burn-in stress testing of the MOSFET at the wafer level may be performed by application of higher than normal gate-to-source voltages at high temperatures to test the reliability of the gate oxide. Note that this gate-source stress is only applied the main set of MOSFET cells, not to the numerically much fewer S1 MOSFET cells. (Block 62)

Following stress testing, each of the MOSFET devices fabricated on the wafer is individuated as separate die. (Block 63) For those devices that passed stress testing, the die are mounted in a package and wire bonded as described in conjunction with FIG. 1B. That is, the gate pad is wire bonded to a gate terminal or pin of the package; and the sources of the main and secondary (S1) MOSFETs are wire bonded to a source terminal of the package. (Block 64) With the main source contact electrically connected to the S1 source contact, asymmetrical gate clamping between the gate and source is activated to protect the gate oxide of the SiC MOSFET from overvoltage stress.

The above description of illustrated examples of the present disclosure is not intended to be exhaustive or to be limitation to the precise forms disclosed. While specific embodiments of, and examples for, the invention are described herein for illustrative purposes, various equivalent modifications are possible without departing from the broader spirit and scope of the present invention. For instance, while the invention has been described using examples of an n-channel MOSFET device (enhancement mode) the inventive concepts disclosed may also apply to a p-channel MOSFET (depletion mode) devices. Indeed, it is appreciated that the specific example layouts, device structures, methods of operation, etc., are provided for explanation purposes and that other structures, circuits and devices may be employed in other embodiments and examples in accordance with the teachings of the present disclosure. These modifications can be made to the examples provided in light of the above detailed description.

We claim:

1. A metal-oxide semiconductor transistor (MOSFET) device comprising:
   a silicon carbide (SiC) substrate having top and bottom planar surfaces;
   a plurality of main MOSFET cells disposed in a first area of the SiC substrate;
   a plurality of secondary MOSFET cells disposed in a second area of the substrate, each of the main and secondary MOSFET cells including a source region of a first conductivity type disposed in a well region of a secondary conductivity type, a channel region of the well region being disposed at the top planar surface, an insulated gate member disposed over the channel region and above the top planar surface, and a drain region of the first conductivity disposed at the bottom planar surface, the source region and the well region being disposed in an upper layer of the SiC substrate, the upper layer being of the first conductivity type;
   a main source contact electrically coupled to the source region of each of the main MOSFET cells;
   a secondary source contact electrically coupled to the source region of each of the secondary MOSFET cells;
   a gate contact disposed in a third area of the SiC substrate, the gate contact being electrically connected to each of the insulated gate members of the main and secondary MOSFET cells;
   a gate clamping circuit coupled between the secondary source contact and the gate contact;
   wherein in a first mode of operation of the MOSFET device the main source contact is electrically coupled with the secondary source contact such that the gate clamping circuit is activated to clamp a gate-to-source voltage to a first clamp voltage in an on-state of the MOSFET device, and to a second clamp voltage in an off-state of the MOSFET device, in a second mode of operation the main source contact being electrically isolated from the secondary source contact such that the gate clamping circuit is not activated for the main MOSFET cells.

2. The MOSFET device of claim 1 wherein each of the main and secondary MOSFET cells further includes a contact region of the second conductivity type disposed at the top planar surface, the contact region laterally adjoining the source region and the well region, the MOSFET device further comprising two or more floating regions of the second conductivity type disposed in the upper layer in a first boundary area between the first and second areas of the SiC substrate.

3. The MOSFET device of claim 2 wherein the first boundary area is located between the contact area of a main MOSFET cell and the contact area of a secondary MOSFET cell taken across a first cross-section in a first lateral direction.

4. The MOSFET device of claim 3 wherein the two or more floating regions are spaced-apart in the first lateral direction by a first distance.

5. The MOSFET device of claim 4 wherein the first distance is in a range of approximately 0.8 µm to 1.0 µm wide.

6. The MOSFET device of claim 2 wherein the first conductivity type is N-type and the second conductivity type is P-type.

7. The MOSFET device of claim 6 wherein the gate clamping circuit comprises:
   a floating P-type well region disposed in the upper layer in a second boundary area between the second and third areas taken across a second cross-section in a second lateral direction;
   first and second N+ regions disposed in the extended well at the top planar surface, the first N+ region electrically contacting the gate contact and the second N+ region electrically contacting the secondary source contact, the second N+ region extending deeper in a vertical direction into the P-type well region than the first N+ region; and
   first, second, and third P+ regions, the first and second P+ regions being disposed on opposite lateral sides of the first N+ region along the second lateral direction, and the second and third P+ regions being disposed on opposite lateral sides of the second N+ region along the second lateral direction.

8. The MOSFET device of claim 7 wherein the floating P-type well region has a retrograde doping profile in the vertical direction such that a p-n junction formed at a bottom of the second N+ region has a breakdown voltage that is lower as compared with a breakdown voltage of a p-n junction formed at a bottom of the first N+ region.

9. The MOSFET device of claim 8 wherein the retrograde doping profile has a lowest doping concentration near the top planar surface and a highest doping concentration near a bottom of the floating P-type well region.

10. The MOSFET device of claim 7 further comprising a fourth P+ region disposed in the upper layer spaced-apart in the second direction between the third P+ region and the contact region of a secondary MOSFET cell.

11. The MOSFET device of claim 10 further comprising a fifth P+ region disposed in the upper layer spaced-apart in the second direction between the first P+ region and a P+ region disposed in the upper layer beneath the gate contact.

12. The MOSFET device of claim 1 wherein in the first mode of operation the main source contact is electrically coupled with the secondary source contact via wire bonding.

13. The MOSFET device of claim 1 wherein in the first clamp voltage is approximately 30 volts and the second clamp voltage is approximately −12 volts.

14. The MOSFET device of claim 1 wherein the main and secondary MOSFET cells further include a drift region disposed above the drain region and below the upper layer, the upper layer comprising a current spreading layer (CSL) of the first conductivity type.

15. The MOSFET device of claim 1 wherein in the first mode of operation the main source contact and the secondary source contact are each electrically coupled to a source terminal via a wire bond.

16. The MOSFET device of claim 15 further comprising a sense resistor connected in series with the wire bond between the secondary source contact and the source terminal.

* * * * *